(12) United States Patent
Necco et al.

(10) Patent No.: US 6,930,371 B2
(45) Date of Patent: Aug. 16, 2005

(54) TEMPERATURE-SENSING DIODE

(75) Inventors: Fabio Necco, Manhattan Beach, CA (US); Davide Chiola, Marina del Rey, CA (US); Kohji Andoh, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/771,559

(22) Filed: Feb. 3, 2004

(65) Prior Publication Data

US 2004/0222430 A1 Nov. 11, 2004

Related U.S. Application Data

(60) Provisional application No. 60/445,000, filed on Feb. 3, 2003.

(51) Int. Cl.[7] ............................................. H01L 31/058
(52) U.S. Cl. ........................ 257/467; 257/470; 257/659
(58) Field of Search ................................ 257/467, 470, 257/659

(56) References Cited

U.S. PATENT DOCUMENTS

| | | | |
|---|---|---|---|
| 4,047,435 A | 9/1977 | Keith ........................... | 73/362 |
| 4,896,196 A | 1/1990 | Blanchard et al. .......... | 357/23.4 |
| 5,049,961 A | 9/1991 | Zommer et al. .............. | 357/28 |
| 5,119,265 A | 6/1992 | Qualich et al. ............. | 361/103 |
| 5,726,481 A | 3/1998 | Moody ........................ | 257/467 |
| 6,268,986 B1 | 7/2001 | Kobayashi et al. ............ | 361/24 |
| 6,291,826 B1 | 9/2001 | Kubō et al. ............. | 250/370.15 |
| 6,342,997 B1 | 1/2002 | Khadkikar et al. .......... | 361/103 |
| 6,363,490 B1 | 3/2002 | Senyk ......................... | 713/300 |
| 2004/0017437 A1 | 1/2004 | Yamaguchi et al. .......... | 347/64 |

OTHER PUBLICATIONS

Data Sheet No. IRLBD59N04E, International Rectifier Corporation, 8 pages, Nov. 13, 2001.
EDN—Automotive MOSFET Integrates Temperature–Sensing Protection, Jun. 5, 2000, by Bill Schweber, 3 pages, downloaded Jan. 30, 2004.

*Primary Examiner*—Long Pham
(74) *Attorney, Agent, or Firm*—Ostrolenk, Faber, Gerb & Soffen, LLP

(57) ABSTRACT

A temperature-sensing diode has an anode and a cathode disposed on top and an isolated, metallization layer on bottom of a diode die. For example, the temperature-sensing diode is a Schottky diode without a guard ring and any passivation, making the temperature-sensing diode inexpensive to fabricate, easy to attach in close proximity to a heat-generating device and resistant to electronic noise from high power devices and stray electronic signals. The location of the anode and cathode on the same surface of the diode package provides for easy connection, such as by wire bonds, with an external circuit for providing a constant forward bias current and for amplification of the output voltage signal by an operational amplifier. The isolated, metallization layer provides for easy attachment of the temperature-sensing diode in close proximity to heat-generating power devices. A dielectric film isolates the temperature-sensing diode from the metallization layer and underlying substrate.

20 Claims, 5 Drawing Sheets

TEMPERATURE-SENSING DIODE

RELATED APPLICATION

This application claims the benefit of U.S. Provisional Application Ser. No. 60/445,000, filed Feb. 3, 2003, entitled "Silicon Temperature Sensing on Power Module Design for Automotive Applications," which is incorporated in its entirety by reference herein.

FIELD OF THE INVENTION

The field of the invention is a temperature-sensing diode. More specifically, a temperature sensing diode that is insulated from a common conductive or semiconductive substrate from a power transistor.

BACKGROUND OF THE INVENTION

Temperature is one of the most commonly measured parameters in electronic systems. There are many reasons for measuring temperature of an electronic device. One reason is for providing accurate measurements of other parameters that are influenced by the temperature of the sensor itself. Another reason is for protection of power electronics from damage caused by over-temperature conditions, which can degrade the performance and reliability of the power electronics. For example, a temperature sensor may be integrated with a power electronics module to shut down the power to the module if temperature exceeds a critical value. Often, this is accomplished using a comparator and a temperature-sensing device. Typical temperature sensing devices are thermocouples or thermistors that output a voltage that may be calibrated with a temperature or reading and may be compared to a fixed threshold voltage.

For example, in an automotive power module, such as a power half bridge, temperature is measured to protect the silicon components from heating beyond a rated temperature limitation and for implementing temperature-dependent strategies in the power control system. In conventional systems, the temperature sensor is usually affixed on the outer surface of the power module. However, the accuracy and responsiveness of temperature measurements decrease with the following:

1. distance between the sensing element and the power devices, such as power switching transistors;
2. the quality and conductivity of the bond between the sensor and power devices; and
3. thermal resistance from insulating materials inserted between the sensing element and conductive or semiconductive elements of the power devices to prevent stray voltages from interfering with the signal of the sensing element.

Thus, it is preferred to place the sensing element as close as possible to the silicon. It is also preferred to have a highly conductive path between the power device and the sensing element, but for the sensing element to be insulated electrically from the high voltages of the power devices, reducing the signal to noise ratio by preventing noise coupling with the control system. The lack of responsive and accurate temperature measurements affects overall device performance. Unresponsive measurements may allow power devices to inadvertently enter an over-temperature condition, which causes damage to the power devices. Alternatively, designers of the power device may adjust the temperature rating of the power device downwards to accommodate a slower response. By reducing the temperature rating, the designers reduce power device efficiency by unnecessarily throttling back the power device at temperatures lower than the actual temperature that is safe for operation of the power device.

Recently, International Rectifier has begun integrating temperature-sensing diodes as part of its power transistor packages, such as in part no. IRLBD59N04E, the data sheet of which is incorporated herein by reference in its entirety for use as background. The date sheet shows two antiparallel, electrically isolated poly-silicon diodes integrated in a MOSFET package.

Some integrated, temperature-sensing diodes have been integrated on the same silicon, semiconductive substrate as a processor, such as the temperature-sensing diode of U.S. Pat. No. 6,363,490. However, a diode on the silicon substrate is not sufficiently isolated for use with power transistors. Instead, the high voltages of power transistors cause excessive noise, which may mask the temperature-dependent signals and may delay responsive measurements.

U.S. Pat. No. 5,049,961 discloses a temperature-sensing diode that is formed directly on a silicon substrate without a dielectric layer, which has a constant current and must have a high enough voltage level to overcome noise interference from the power transistor. Thus, the temperature-sensing diode uses more power than an isolated sensing device that operates at a lower voltage level. U.S. Pat. No. 4,896,196 discloses a temperature-sensing diode that is formed directly on a silicon substrate with a dielectric isolation layer such as $SiO_2$ isolating the diode from the silicon substrate. However, the location of the diode for both of these integrated sensing devices is limited to the surface region of the power device by conventional processing considerations. In addition, the location may interfere with heat removal from the power device by increasing thermal resistance to a heat sink on the surface of the power device package, for example. Also, U.S. Pat. No. 5,726,481 (the '481 Patent) discloses that such integrated sensing devices often experience noise induced false indications, especially as the thickness of the layer of insulation between the semiconductive substrate and the temperature-sensing diode is reduced to improve thermal response. Thus, the '481 Patent recommends shielding the sensing device by electrically connecting a conductive layer overlying substantially all of the device and the semiconductive silicon substrate underlying the sensing device. However, this prevents the attachment of independent leads to the anode and cathode of the temperature-sensing diode to isolate the sensing device from the power device. Instead, the '481 Patent teaches connection of one electrode of the sensing device to the power device ground.

SUMMARY OF THE INVENTION

A temperature-sensing diode has an anode and a cathode disposed on a first surface of a diode package, and an isolated, attachable surface on a second surface, opposite of the first surface of the diode package. For example, the temperature-sensing diode may be a Schottky diode or a PIN rectifier diode. The location of the anode and cathode on the same surface of the diode package provides for easy connection with an external circuit for providing a constant bias current and for amplification of the output voltage signal by an operational amplifier. The amplifier circuit increases the signal strength from the temperature-sensing diode such that a substantial change in temperature of the temperature-sensing diode is reflected by a substantial change in output signal voltage from the amplifier circuit. By substantial change, it is meant that the change is a measurable change in the temperature or voltage, using conventional temperature sensors and voltage comparators, for example.

The isolated, attachable surface opposite of the anode and cathode provides for easy attachment of the temperature-sensing diode in close proximity to heat-generating power devices. The isolated, attachable surface may have a dielectric layer deposited on the bottom of the semiconductor followed by metallization of the dielectric layer to provide a solderable surface that is isolated from the temperature-sensing diode. Specifically, an oxide layer, such as silica, with a thickness adequate for isolating the temperature-sensing diode from rated voltage spikes in the power device allows mounting of the temperature-sensing diode to a conductive or semiconductive surface in common with the power device.

One advantage of the present invention is that the temperature-sensing diode may be placed in close proximity to heat-generating power devices and with great flexibility in choice of location such that thermal management of the power devices, such as by heat sinks, is not obstructed. Another advantage is that a single temperature-sensing diode may be used to sense over-temperature conditions of heat-generating power devices. Yet another advantage is that the temperature-sensing diode has a high temperature gradient at a constant, low forward current, providing for accurate and responsive detection of over-temperature conditions.

Other features and advantages of the present invention will become apparent from the following description of the invention which refers to the accompanying drawings.

DETAILED DESCRIPTION OF PREFERRED EMBODIMENTS OF THE INVENTION

Figure 1A:
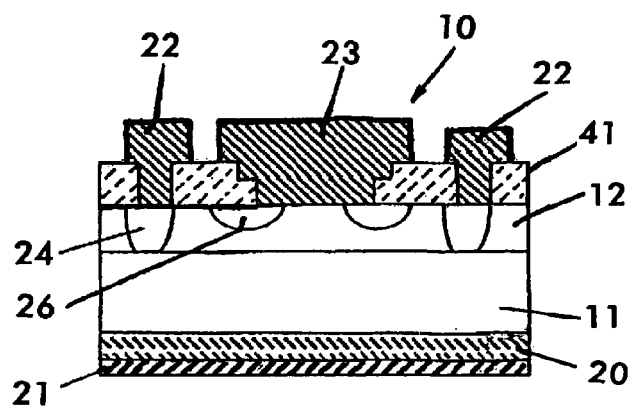
FIG. 1A illustrates a temperature-sensing diode 10 according to one embodiment of the present invention.
Figure 1B:
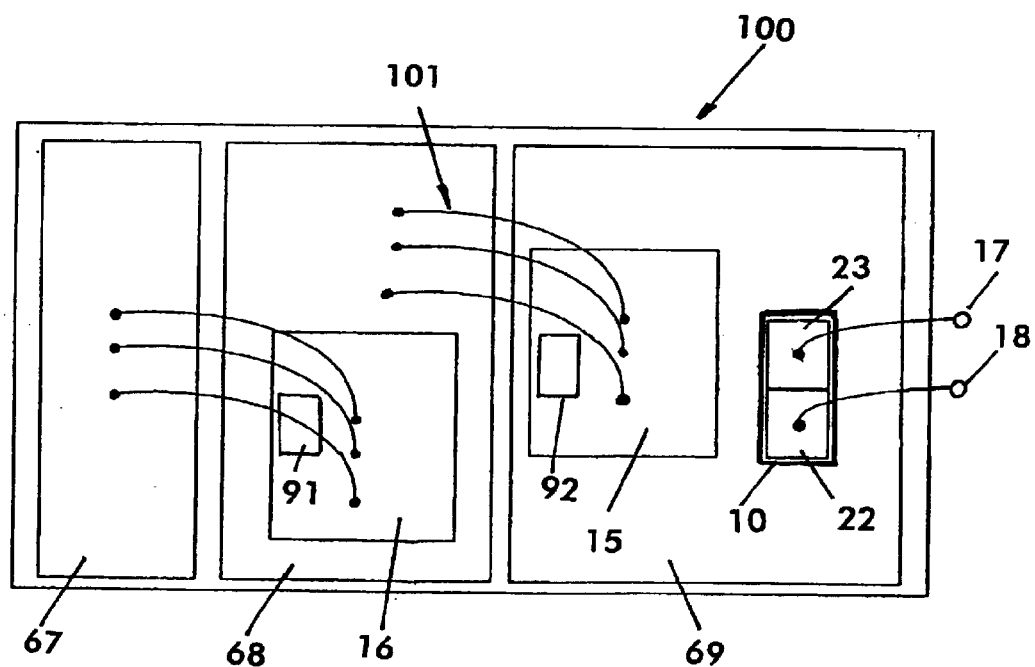
FIG. 1B shows a temperature-sensing diode 10 disposed in close proximity to a heat-generating power device 15 in an electronic package 100.

In one embodiment as shown in FIG. 1A, a temperature-sensing diode 10 has an aluminum cathode 23 and an aluminum anode 22 operably mounted on a top surface of a diode semiconductor die 11 and an isolated, solderable bottom surface 21 opposite of the top surface. For example, the solderable bottom surface 21 allows the temperature-sensing diode 10 to be easily attached to a conductive die pad in close proximity to a heat-generating power device 15, such as a MOSFET for power switching applications, as shown in FIG. 1B. In one example, the temperature-sensing diode is a Schottky diode. In an alternative embodiment, the temperature-sensing diode is a P/instrinsic/N ("PIN") rectifier diode.

Figure 4A:
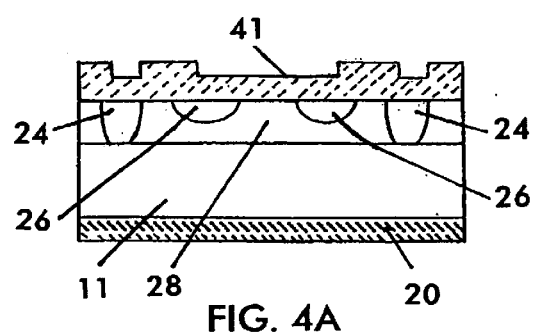
FIGS. 4A–4D illustrate a process for fabricating a temperature-sensing diode 10.

The Schottky temperature-sensing diode has an $N^+$ substrate 11 with an N-type epitaxial silicon layer 12 deposited on the top surface of the substrate 11. Doped $P^+$ regions 26 and $N^+$ regions 24 are provided using any conventional process in the epitaxial silicon layer 12, as shown in FIG. 4A. An oxide mask layer 41 is provided on the top surface of the semiconductor die 11. A dielectric layer 20, such as an oxide film, is deposited on the bottom surface of the semiconductor die 11, as shown in FIG. 4A. Preferably, the oxide film is a silicon oxide produce by any conventional method, such as a high temperature oxidation step, and the oxide film has a thickness of 5000–8000 Angstroms. Within this range of film thickness, the thermal responsiveness of the Schottky temperature-sensing diode is very good and the isolation is adequate to protect against voltage spikes of about 500 V, for example.

Figure 4B:
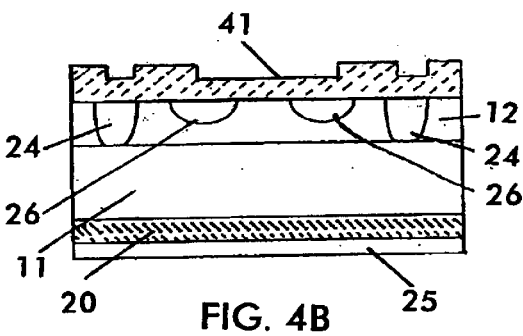
Figure 4C:
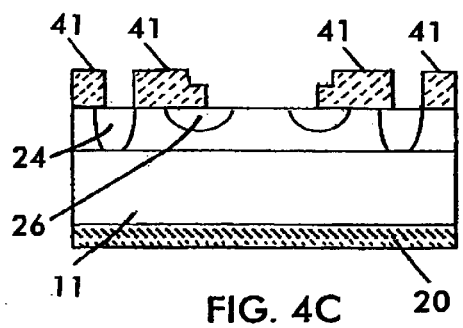
Figure 4D:
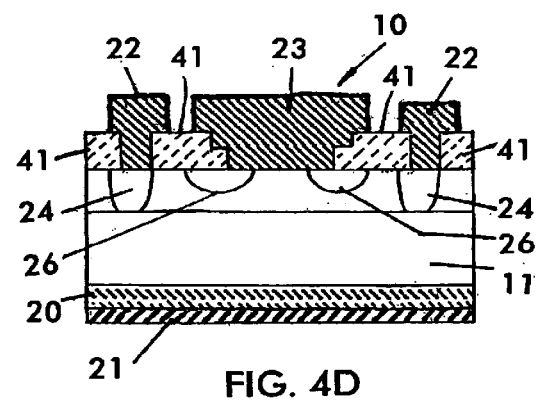

In FIG. 4B, a resist layer 25 is disposed on the bottom dielectric layer 20, protecting the bottom dielectric film 20 during etching of windows in the oxide layer 41 of the top surface. FIG. 4C shows the contact openings etched in the oxide layer 41 of the top surface and the dielectric film 20 of the bottom surface after the resist 25 is removed. Metallization of the contacts, e.g. anode 23 and cathode 22, and the bottom surface, e.g. metallization layer 21 is completed, as shown in FIG. 4D. For example, the metallization process provides a layer of an aluminum, such as a solderable aluminum layer, as a top metallization layer on each of the cathode 22 and the anode 23 and the bottom surface of metallization layer 21. Any conventional metallization process may be used to form the cathode 22 and the anode 23.

Figure 6:
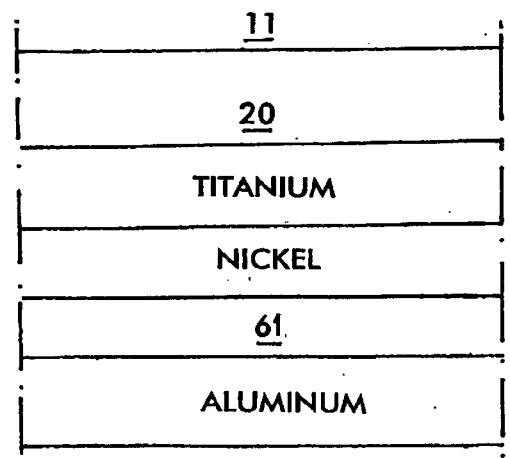
FIG. 6 shows a detailed view of a cross section of the bottom dielectric film 20 and metallization layer 21 deposited on semiconductor substrate 11.

As shown in FIG. 6, one example of the metallization layer 21 on the bottom surface of the semiconductor die 11 has a layer of titanium in contact with the dielectric film 20, for example. A titanium layer forms a strongly adhered bond between the metallization layer 21 and an oxide layer, which may be used as the dielectric film 20. Next, a layer of nickel is deposited on the layer of titanium to reduce any diffusion of impurities between the surface of the metallization layer 21 and the substrate 11. Next an oxidation-resistant layer is deposited, such as silver or gold. A layer of an aluminum may be deposited next on the oxidation-resistant layer to provide a solderable surface layer.

Figure 2:
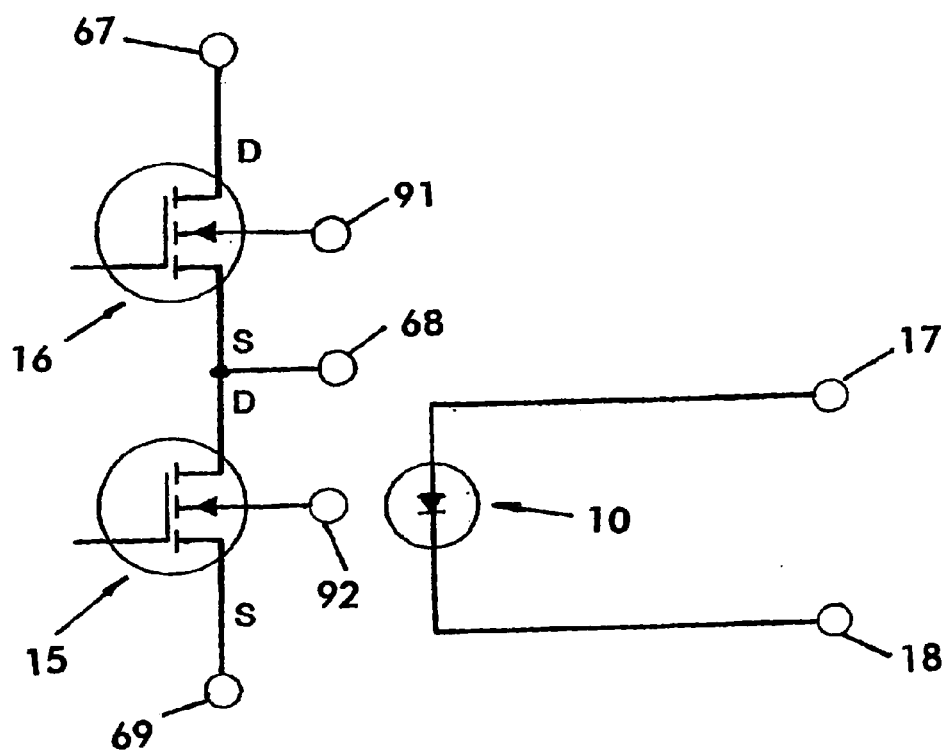
FIG. 2 shows a circuit diagram of the embodiment shown in FIG. 1B.
Figure 3:
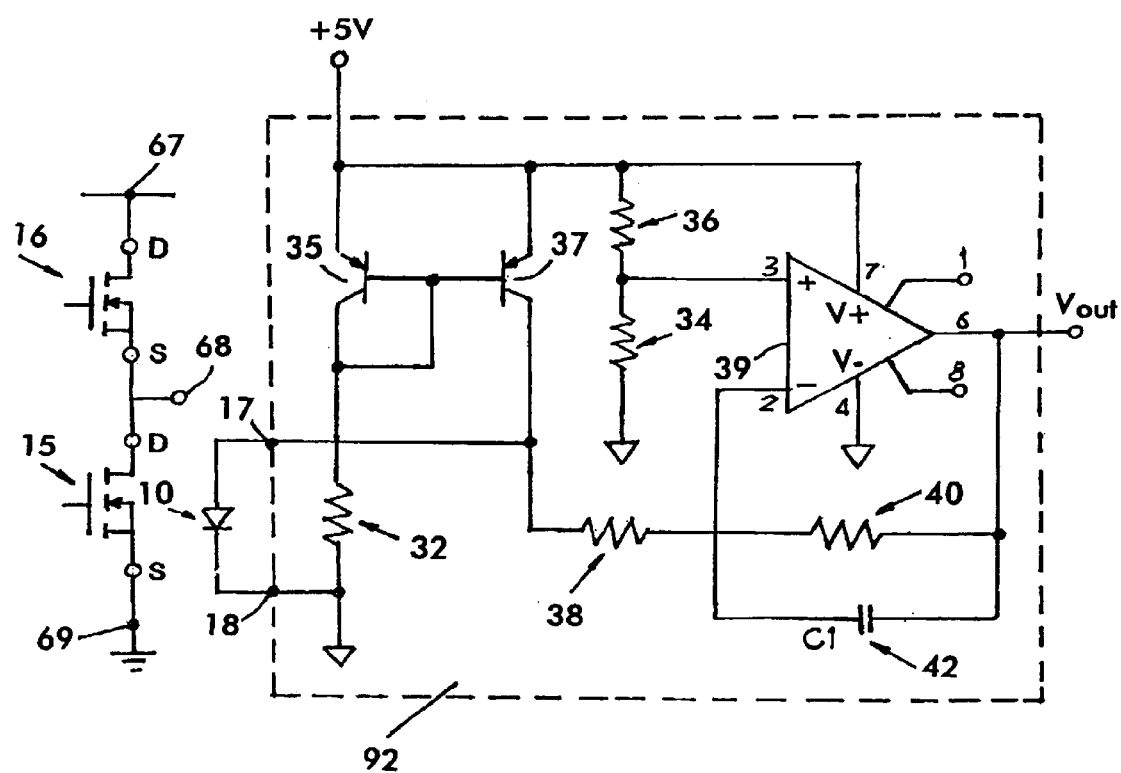
FIG. 3 shows the circuit of FIG. 2 combined with a circuit including an operation amplifier 39 operably coupled to the temperature-sensing diode 10, which is mounted in close proximity to the heat-generating power device 15.

The location of the anode 23 and cathode 22 on the same surface of the temperature-sensing diode 10 provides for easy connection with an external circuit, as shown in FIGS. 1B, 2 and 3, for example. In FIG. 1B, the temperature-sensing diode 10 is positioned in close proximity to a heat-generating MOSFET 15 on a common conductive die pad 69, which may serve as the power device ground terminal. The cathode 22 and anode 23 are shown diagrammatically as two boxes, side-by-side; however, any electrode pattern may be used to form the electrodes on the surface of the die 11, such as shown in the temperature-sensing diode 10 of FIG. 1A. The MOSFET 15 is mounted on the surface of the die pad 69 and is electrically coupled to an external circuit (not shown) and to a second MOSFET 16. For example, wire bonds 101 couple the heat-generating MOSFET 15 to the second MOSFET 16 via a second die pad 68. The second die pad 68 is electrically conductive and wire bondable and may also connect the heat-generating MOSFET 15 and the second MOSFET 16 to the external power management circuit (not shown). The second MOSFET 16 is also electrically coupled to device input voltage bus.

Transistor gate driving circuitry (not shown) may be coupled to the gates 91, 92 of the second MOSFET 16 and heat-generating MOSFET 15, respectively. The gate driving circuitry may be any gate driving circuitry, such as the gate driving circuitry disclosed in co-pending Application No. 10/696,711, filed Oct. 29, 2003, entitled "Half-bridge high voltage gate driver providing protection of a transistor," which is incorporated herein by reference in its entirety for providing the structure and functioning of an example of a gate driver.

Figure 5:
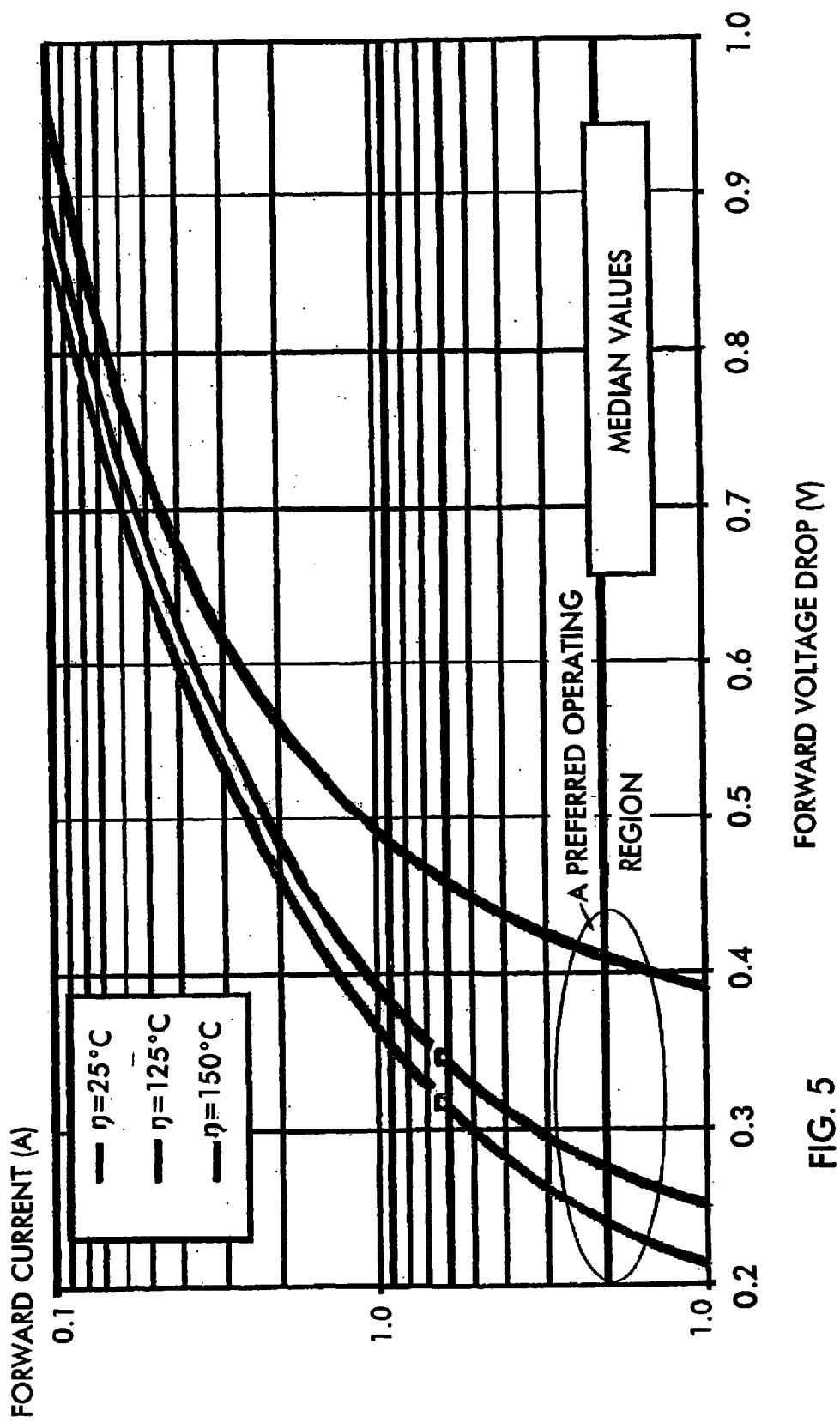
FIG. 5 shows a graph of the forward current versus forward voltage drop for a Schottky temperature-sensing diode at 25, 125 and 150 degrees centigrade.

FIG. 2 shows a circuit diagram for the co-packaged power MOSFETs 15,16 with a temperature-sensing diode disposed in close proximity to the heat-generating MOSFET 15. For example, in FIG. 3, the co-packaged device is shown coupled at the temperature-sensing diode's terminals 17,18 to a constant current source and operational amplifier circuit 92, as shown within the dashed box. The voltage signal $V_{out}$ output from the circuit 92 may be compared to a reference voltage to determine an over-temperature condition in the heat-generating MOSFET 15. The voltage signal $V_{out}$ may also be converted to a temperature by referring to the characteristic relationship between forward current, forward voltage drop and temperature of the temperature-sensing diode 10, as shown in FIG. 5. For example, a preferred region for operating the temperature-sensing diode is shown in FIG. 5. A constant current may be used that is much less than the normal operating temperature of a Schottky diode, which reduces power consumption and increases the accuracy of temperature measurements. For example, a constant current in a range of at least 0.1 A and no greater than 0.3 A provides adequate sensitivity at low power.

In one example, the temperature-sensing diode is coupled to the constant current source and operational amplifier circuit 92 of FIG. 3. Two transistors 35, 37 are coupled gate-to-gate and to a +5 V supply and a resistor 32 (e.g. 4.3 kOhms), providing a constant current forward bias within a preferred operating region for the temperature-sensing diode 10. The power amplifier 39 is coupled to the +5 V supply, across the voltage drop across the terminals 17, 18 of the temperature-sensing diode 10 and to resistors 34, 36, 38, 40 and capacitor 42, e.g. 10 kOhms, 48.7 kOhms, 10 kOhms, 88.7 kOhms and 10 nF, respectively. The power amplifier 39 is operably coupled to provide an amplified voltage signal $V_{out}$, which may be used to determine an over-temperature condition, using a conventional comparator, for example. In one example, the power devices 15, 16 of FIG. 3 may be MOSFETs, such as IRF034 power control MOSFETs.

In order to minimize the power dissipation of the sensing element, a small signal current is preferred, well below the rated current of the Schottky diode. This region of operation provides a comparatively large temperature gradient of the forward bias current-voltage drop characteristics, hence improving the resolution of the sensing element. Another advantage of operating at low current level is the reduced spreading of the forward voltage $V_f$ distribution at high temperature, improving the accuracy of temperature measurements. Higher forward current density and higher temperatures cause the contribution of temperature-dependent series resistances (contact resistance, epi resistance, etc.) to become significant. Thus, any variation of these components is reflected in the variation of the measured forward voltage $V_f$ to at least some degree.

Unlike conventional rectifiers, the temperature-sensing diode 10 may eliminate passivation that is usually necessary to reduce leakage current. For example, the P+ guard ring may be eliminated, reducing the number of processing steps and thereby reducing costs of manufacture compared to conventional diodes. Since the diode is always supplied with a forward bias current, there is no need for guard ring termination in the temperature-sensing diode. Furthermore, the structure of the temperature-sensing diode 10 allows it to be soldered to the same substrate as the heat-generating device 15, because both the anode 23 and the cathode 22 are electrically insulated from the rest of the circuit by the dielectric film 20 and the isolated, solderable bottom layer 21. Alternatively, the temperature-sensing device may be bonded to the same substrate by an adhesive, such as an insulative or conductive epoxy, or by any other conventional bonding process.

The temperature-sensing diode 10 may be disposed on the surface of a conductive or semiconductive substrate using standard pick and place manufacturing methods and may be soldered using automated processes and/or simultaneously with other solderable components, such as the power devices 15, 16. Furthermore, the anode 23 and the cathode 22 may be "wire-bonded" making the process compliant with industry standard technology. The temperature-sensing diode 10 is isolated from the rest of the circuit by the dielectric film 20, reducing electronic noise generated by other components, and the cost of using the temperature-sensing diode is less than the cost of using a comparable thermistor.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A temperature-sensing device for use in protecting a heat-generating power device from an over-temperature condition comprises:

a semiconductor substrate having a first surface, a second surface opposite of the first surface and a diode structure;

a cathode and an anode electrically coupled to the diode structure and disposed on the first surface of the semiconductor substrate, wherein the diode structure is temperature sensitive such that a change in temperature of the diode structure causes a predictable change in the voltage drop across the anode and the cathode while a constant forward bias current is applied;

a dielectric layer formed on the second surface of the semiconductor substrate such that the second surface of the semiconductor substrate is electrically isolated; and a metallization layer formed on the dielectric layer such that the metallization layer is bound to the dielectric and is attachable to a conductive or semiconductive substrate.

2. The device of claim 1, wherein the diode structure is a Schottky diode structure or a PIN rectifier diode structure.

3. The device of claim 2, wherein the diode structure is a Schottky diode structure.

4. The device of claim 1, wherein the dielectric layer has a thickness and the thickness is selected in a range from at least 5000 Angstroms to no greater than 8000 Angstroms.

5. The device of claim 4, wherein the dielectric layer isolates the semiconductor substrate from voltage spikes of about 500 Volts.

6. The device of claim 1, wherein the metallization layer is solderable.

7. The device of claim 5, wherein the metallization layer is comprised of a layer titanium formed on the dielectric layer, a layer of nickel formed on the titanium layer and an oxidation resistant layer formed on the layer of nickel.

8. The device of claim 6, wherein the oxidation resistant layer is of silver.

9. The device of claim 6, wherein the metallization layer further comprises a layer of an aluminum formed on the oxidation resistant layer.

10. The device of claim 1, further comprising:

a constant forward bias current and operational amplifier circuit coupled to the anode and the cathode of the semiconductor die, wherein a constant forward bias current is applied to the semiconductor die and a voltage drop across the semiconductor die is amplified such that an amplified voltage from the amplifier circuit indicates a measurable change in the voltage drop with a measurable change in temperature of the semiconductor die.

11. The device of claim 9, wherein the diode structure is a Schottky diode structure or a PIN rectifier diode structure.

12. The device of claim 10, wherein the diode structure is a Schottky diode structure.

13. The device of claim 9, wherein the dielectric layer has a thickness and the thickness is selected in a range from at least 5000 Angstroms to no greater than 8000 Angstroms.

14. The device of claim 4, wherein the dielectric layer isolates the semiconductor substrate from voltage spikes of about 500 Volts.

15. The device of claim 9, wherein the metallization layer is solderable.

16. The device of claim 13, wherein the metallization layer is comprised of a layer titanium formed on the dielectric layer, a layer of nickel formed on the titanium layer and an oxidation resistant layer formed on the layer of nickel.

17. The device of claim 14, wherein the oxidation resistant layer is of silver.

18. The device of claim 14, wherein the metallization layer further comprises a layer of an aluminum formed on the oxidation resistant layer.

19. The device of claim 1, wherein the semiconductor die is capable of being positioned in close proximity to the heat-generating power device.

20. The device of claim 17, wherein the heat-generating power device is a power MOSFET and the metallization layer is soldered to the same conductive substrate as the power MOSFET.

* * * * *